US010726927B2

(12) United States Patent
Murakami

(10) Patent No.: US 10,726,927 B2
(45) Date of Patent: Jul. 28, 2020

(54) SEMICONDUCTOR MEMORY DEVICE

(71) Applicant: Winbond Electronics Corp., Taichung (TW)

(72) Inventor: Hiroki Murakami, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/231,402

(22) Filed: Dec. 22, 2018

(65) Prior Publication Data

US 2019/0237147 A1 Aug. 1, 2019

(30) Foreign Application Priority Data

Jan. 30, 2018 (JP) .................................. 2018-013282

(51) Int. Cl.
| | |
|---|---|
| *G11C 7/00* | (2006.01) |
| *G11C 16/30* | (2006.01) |
| *G11C 16/14* | (2006.01) |
| *G11C 16/08* | (2006.01) |
| *H02M 3/07* | (2006.01) |
| *H03K 5/24* | (2006.01) |

(52) U.S. Cl.
CPC .............. *G11C 16/30* (2013.01); *G11C 16/08* (2013.01); *G11C 16/14* (2013.01); *H02M 3/07* (2013.01); *H03K 5/2472* (2013.01)

(58) Field of Classification Search
CPC ......... G11C 16/30; G11C 16/08; G11C 16/14; H02M 3/07; H03K 5/2472
USPC ................................................... 365/185.18
See application file for complete search history.

(56) References Cited

U.S. PATENT DOCUMENTS

| 7,038,482 B1* | 5/2006 | Bi ...................... G01R 31/2621 |
| | | 324/762.09 |
| 7,453,742 B2* | 11/2008 | Maejima ................ G11C 16/24 |
| | | 365/185.21 |
| 7,595,684 B2* | 9/2009 | Maejima ................ G11C 5/145 |
| | | 327/536 |
| 7,880,531 B2* | 2/2011 | Park ...................... H02M 3/073 |
| | | 327/306 |

(Continued)

FOREIGN PATENT DOCUMENTS

| CN | 101136249 | 3/2008 |
| JP | 2002197882 | 7/2002 |

(Continued)

*Primary Examiner* — Viet Q Nguyen
(74) *Attorney, Agent, or Firm* — JCIPRNET

(57) ABSTRACT

A voltage generation circuit, having a circuit scale significantly reduced as compared with the related art, is provided. The voltage generation circuit of the disclosure includes a charge pump outputting a boosted voltage to an output node, a resistor connected between the output node and another output node, and a current source circuit having first and second current paths connected in parallel between the another output node and a reference potential. The first current path includes a resistor and a first DAC. The first DAC generates a first constant current corresponding to a voltage generation code. The second current path includes a second DAC. The second DAC generates a second constant current corresponding to a code obtained by inverting the voltage generation code. Thereby, a driving voltage obtained by lowering the boosted voltage is generated at the other output node.

18 Claims, 5 Drawing Sheets

(56) References Cited

U.S. PATENT DOCUMENTS

| | | | |
|---|---|---|---|
| 7,936,154 B2 | 5/2011 | Lee | |
| 7,944,282 B2* | 5/2011 | Maejima | G11C 5/145 |
| | | | 327/536 |
| 8,125,264 B2* | 2/2012 | Maejima | G11C 5/145 |
| | | | 327/536 |
| 8,278,996 B2* | 10/2012 | Miki | G11C 5/147 |
| | | | 327/103 |
| 8,350,617 B2* | 1/2013 | Ryu | G01R 31/2884 |
| | | | 327/536 |
| 8,598,947 B2* | 12/2013 | Kim | G05F 1/575 |
| | | | 323/271 |
| 8,797,089 B2* | 8/2014 | Suzuki | G11C 5/145 |
| | | | 327/536 |
| 9,112,488 B2* | 8/2015 | Murakami | H03K 19/0016 |
| 9,153,335 B2* | 10/2015 | Murakami | G11C 16/24 |
| 9,859,000 B1* | 1/2018 | Lin | G11C 13/004 |
| 9,887,011 B1* | 2/2018 | Hung | G11C 16/10 |
| 9,899,080 B2* | 2/2018 | Yim | G11C 29/028 |
| 9,929,644 B2* | 3/2018 | Kim | H02M 3/07 |
| 10,096,369 B2* | 10/2018 | Murakami | G11C 16/14 |
| 10,269,409 B2* | 4/2019 | Murakami | G11C 11/4085 |
| 10,297,295 B2* | 5/2019 | Murakami | G11C 7/1063 |
| 2009/0323440 A1* | 12/2009 | Soma | G11C 16/20 |
| | | | 365/189.15 |
| 2010/0128551 A1* | 5/2010 | Tanzawa | G05F 1/575 |
| | | | 365/226 |
| 2019/0006019 A1* | 1/2019 | Wang | G11C 29/025 |

FOREIGN PATENT DOCUMENTS

| | | | | |
|---|---|---|---|---|
| JP | 2019134535 A | * | 8/2019 | G11C 16/30 |
| TW | I572135 | | 2/2017 | |

\* cited by examiner

SEMICONDUCTOR MEMORY DEVICE

CROSS-REFERENCE TO RELATED APPLICATION

This application claims the priority benefit of Japan application serial no. 2018-013282, filed on Jan. 30, 2018. The entirety of the above-mentioned patent application is hereby incorporated by reference herein and made a part of this specification.

BACKGROUND

Technical Field

The disclosure relates to a semiconductor memory device, such as a flash memory, and more particularly relates to a voltage generation circuit using a booster circuit.

Description of Related Art

In a NAND type or NOR type flash memory or the like, a high voltage is required for data reading, programming, and erasing operations. Normally, in the flash memory, a power source voltage supplied from the outside is boosted by a charge pump, and the programming, erasing, and the like are performed using the boosted voltage. In Japanese Laid-open Patent Application No. 2002-197882, a technology has been started for self-boosting a signal for reducing the charge pump and enabling a word line of a word line decoder in order to reduce the layout area of the booster circuit.

FIG. 1A shows a voltage generation circuit of the conventional flash memory. The voltage generation circuit 10 includes a charge pump CP for boosting a voltage, such as Vcc, and a comparator 12 for comparing the voltage with a reference voltage VREF to control the charge pump CP. A resistor ladder having a plurality of resistors connected in series and a transistor controlled by an enable signal EN are formed in series between an output node HV_G of the charge pump CP and a GND. The voltage of a node N1 of the resistor ladder and the reference voltage VREF are inputted to the comparator 12, and the comparator 12 enables or disables the charge pump CP according to the comparison result of the voltage and the reference voltage VREF. A plurality of level shifters DLVS are connected to the resistor ladder, and the resistance of the resistor ladder is variable by the switching circuit of the level shifters DLVS. For example, if the resistance of the resistor ladder increases, the current flowing through the resistor ladder decreases. On the other hand, if the resistance of the resistor ladder decreases, the current flowing through the resistor ladder increases.

The voltage generation circuit 10 further includes another set of comparator 14 and resistor ladder for generating a driving voltage Vdv from an output node HV_S. The resistor ladder is constructed in the same manner as the above-mentioned resistor ladder, and the level shifters DLVS are connected to the resistor ladder. Between the output node HV_G and the output node HV_S, a diode and a transistor Q1 are connected in series. The output node HV_S is connected between the transistor Q1 and the resistor ladder. The reference voltage VREF is supplied to an inverting input of the comparator 14, and the voltage of the node N2 of the resistor ladder is supplied to a non-inverting input. When the voltage of the node N2 becomes higher than the reference voltage VREF, a transistor Q2 turns on and the transistor Q1 turns off. On the other hand, when the voltage of the node N2 becomes lower than the reference voltage VREF, the transistor Q2 turns off and the transistor Q1 turns on.

In order to generate a step voltage by ISPP (Incremental Step Pulse Program) during the program operation and a step voltage by ISPE (Incremental Step Pulse Erase), the resistance of the resistor ladder is variable via the switching circuit of the level shifters DVLS, and thereby the desired driving voltage Vdv is generated at the output node HV_S.

As shown in FIG. 1B, the output nodes HV_G and HV_S of the voltage generation circuit 10 are connected to a high withstand voltage MOS transistor Q3. That is, the output node HV_S is connected to the source or drain of the transistor Q3, the output node HV_G is connected to the gate of the transistor Q3, and the driving voltage Vdv is supplied to the word line or the P well as a programming voltage or erasing voltage. Here, since the threshold value of the transistor Q3 rises due to the substrate bias effect, the gate voltage (the boosted voltage Vcp) needs to be set to a voltage higher than the driving voltage Vdv in consideration of the substrate bias effect.

Such a conventional voltage generation circuit 10 has the following problem. The voltage generation circuit 10 uses a large number of high withstand voltage transistors (the transistors Q1 and Q2, and the transistors constituting the level shifters), and uses relaxation elements (a depletion transistor, etc., having a resistor and a gate grounded) for relaxing the high voltage. Therefore, the circuit scale becomes large. Also, since ISPP and ISPE are used, it is necessary to set the step voltage finely, and in the current circuit, a large number of level shifts have to be prepared, which is one of the factors that cause the circuit scale to increase.

Furthermore, the generation of the driving voltage Vdv has to take account of the substrate bias effect of the transistor Q3. However, in the current circuit, it is difficult to generate the driving voltage in consideration of the substrate bias effect at the same time as the high voltage programming voltage and erasing voltage, and regardless of the value of the boosted voltage Vcp, the difference between the boosted voltage Vcp and the driving voltage Vdv is constant. Therefore, in a region where the programming voltage and the erasing voltage are low, the difference voltage may unnecessarily increase, which is one cause of the increase in power consumption.

SUMMARY

In view of the above, the disclosure provides a voltage generation circuit having a circuit scale that is significantly reduced as compared with the related art. The disclosure further provides a voltage generation circuit capable of generating a desired driving voltage without using a level shifter. The disclosure further provides a voltage generation circuit capable of generating a driving voltage in consideration of the substrate bias effect. The disclosure further provides a voltage generation circuit capable of generating a voltage by setting a resistance for voltage generation constant and varying a current of a current source.

A voltage generation circuit according to the disclosure includes: a booster circuit outputting a boosted voltage to a first node; a first resistor connected between the first node and a second node; and a current source circuit having a first current path and a second current path connected in parallel between the second node and a reference potential. The first current path includes a second resistor and a first current source connected in series to the second resistor. The first current source generates a first constant current corresponding to a first digital code. The second current path includes a second current source having a configuration same as the first current source. The second current source generates a second constant current corresponding to a second digital code obtained by inverting the first digital code. The voltage generation circuit generates a voltage determined by the first digital code and the second digital code at the second node.

In an embodiment, a current flowing through the first resistor is obtained by adding the first constant current and the second constant current. In an embodiment, the first current source includes a plurality of current sources that are operated selectively based on the first digital code, and the second current source includes a plurality of current sources that are that are operated selectively based on the second digital code. In an embodiment, the voltage generation circuit further includes an inverting circuit inverting the first digital code. The first digital code is supplied to the first current source, and the second digital code inverted by the inverting circuit is supplied to the second current source. In an embodiment, the first digital code and the second digital code include trimming information for adjusting the voltage outputted from the second node. In an embodiment, the first current path further includes a third current source connected in parallel to the first current source. The third current source generates a third constant current corresponding to a third digital code. A current obtained by adding the first constant current and the third constant current flows through the first current path. In an embodiment, the third digital code adjusts a difference between a voltage outputted from the first node and the voltage outputted from the second node. In an embodiment, the second current path further includes a fourth current source connected in parallel to the second current source. The fourth current source generates a fourth constant current corresponding to a fourth digital code. A current obtained by adding the second constant current and the fourth constant current flows through the second current path. In an embodiment, the fourth digital code is varied according to a value of the voltage outputted from the second node. In an embodiment, the first current path includes a protection element between the second resistor and the first current source. The second current path includes a protection element between the second node and the second current source. In an embodiment, the first resistor and the second resistor are composed of a conductive polysilicon. In an embodiment, a MOS transistor included in the booster circuit is for a high withstand voltage, and a MOS transistor included in the current source circuit is for a low withstand voltage as compared with the transistor of the booster circuit. In an embodiment, the voltage generation circuit further includes a comparator comparing a voltage of the third node of the first current path with a reference voltage VREF and controlling an operation of the booster circuit based on a comparison result.

A semiconductor memory device according to the disclosure includes a voltage generation circuit having the aforementioned configuration, a memory cell array, a controller controlling an operation related to the memory cell array, and a driving circuit driving the memory cell array. The voltage generated at the second node of the voltage generation circuit is supplied to the driving circuit.

In an embodiment, the driving circuit includes an N-type MOS transistor. The voltage of the first node is supplied to a gate of the N-type MOS transistor, and the voltage of the second node is supplied to a drain of the N-type MOS transistor. In an embodiment, the controller causes the second node to generate a programming voltage via the first digital code and the second digital code when the memory cell array is programmed. In an embodiment, the controller causes the second node to generate an erasing voltage via the first digital code and the second digital code when the memory cell array is erased. In an embodiment, the memory cell array includes a NAND string.

According to the disclosure, constant currents flow through the resistor connected between the first node and the second node with use of the first current source and the second current source connected to the first current path and the second current path, so as to generate the voltage from the second node. Therefore, unlike the related art, the desired voltage is generated at the second node without using a level shifter. In addition, the number of high withstand voltage elements is reduced as compared with the related art, and the circuit scale of the voltage generation circuit is reduced. Furthermore, it is possible to individually control the voltage difference between the first node and the second node.

DESCRIPTION OF THE EMBODIMENTS

Hereinafter, embodiments of the disclosure will be described in detail with reference to the drawings. In an embodiment, a semiconductor memory device according to the disclosure is a NAND type flash memory, but it is only an example, and it may be a semiconductor memory having another configuration.

Figure 2:
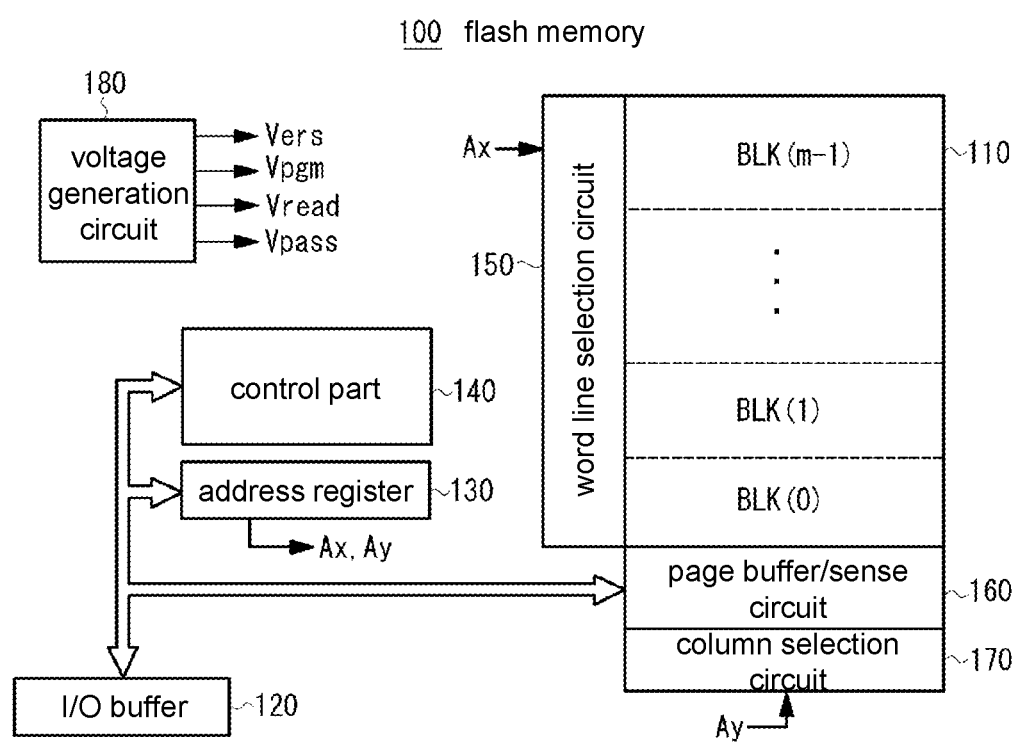
FIG. 2 is a diagram showing the configuration of a flash memory according to an embodiment of the disclosure.

FIG. 2 shows the configuration of a flash memory according to an embodiment of the disclosure. As shown in the figure, the flash memory 100 includes a memory array 110 having a plurality of memory cells arranged in rows and columns; an I/O buffer 120 connected to an external input/output terminal I/O and holding input/output data; an address register 130 receiving address data from the I/O buffer 120; a control part 140 receiving command data from the I/O buffer 120 or an external control signal and controlling each part; a word line selection circuit 150 receiving row address information Ax from the address register 130 and selecting a block and selecting a word line or the like based on a decoding result of the row address information Ax; a page buffer/sense circuit 160 holding data read from a page selected by the word line selection circuit 150 and holding writing data to the selected page; a column selection circuit 170 receiving column address information Ay from the address register 130 and selecting data in the page buffer/sense circuit 160 based on a decoding result of the column address information Ay; and a voltage generation circuit 180 generating various voltages (writing voltage Vpgm, pass voltage Vpass, reading pass voltage Vread, erasing voltage Vers, and so on) for reading, programming, erasing, and so on.

The memory array 110 has m memory blocks BLK(0) BLK(1), . . . , and BLK(m−1) arranged in the column direction. A plurality of NAND strings are formed in one memory block. One NAND string includes a plurality of memory cells connected in series, a bit line side selection transistor, and a source line side selection transistor, wherein the bit line side selection transistor is connected to a corresponding bit line, and the source line side selection transistor is connected to a common source line. The memory cell may be a SLC type memory cell for storing 1 bit (binary data) or a MLC type memory cell for storing multiple bits.

The control gate of the memory cell is connected to a word line. The gates of the bit line side selection transistor and the source line side selection transistor are connected to selection gate lines SGD and SGS. The word line selection circuit 150 selects a block or a word line based on the row address information Ax and drives the selection gate lines SGD and SGS according to the operation state.

In a reading operation, a certain positive voltage is applied to the bit line, a certain voltage (for example, 0V) is applied to the selected word line, a pass voltage Vpass (for example, 4.5V) is applied to the unselected word lines, a positive voltage (for example, 4.5V) is applied to the selection gate lines SGD and SGS, the bit line side selection transistor and the source line side selection transistor are turned on, and 0V is applied to the common source line. In a programming (writing) operation, a high-voltage programming voltage Vpgm (15V to 25V) is applied to the selected word line, an intermediate potential (for example, 10V) is applied to the unselected word lines, the bit line side selection transistor is turned on, and the source line side selection transistor is turned off, and a potential corresponding to the data of "0" or "1" is supplied to the bit line GBL. In an erasing operation, 0V is applied to the selected word line in the block, a high voltage (for example, 20V) is applied to the P well, electrons of the floating gate are pulled out to the substrate, and the data is erased in the unit of a block.

Figure 3:
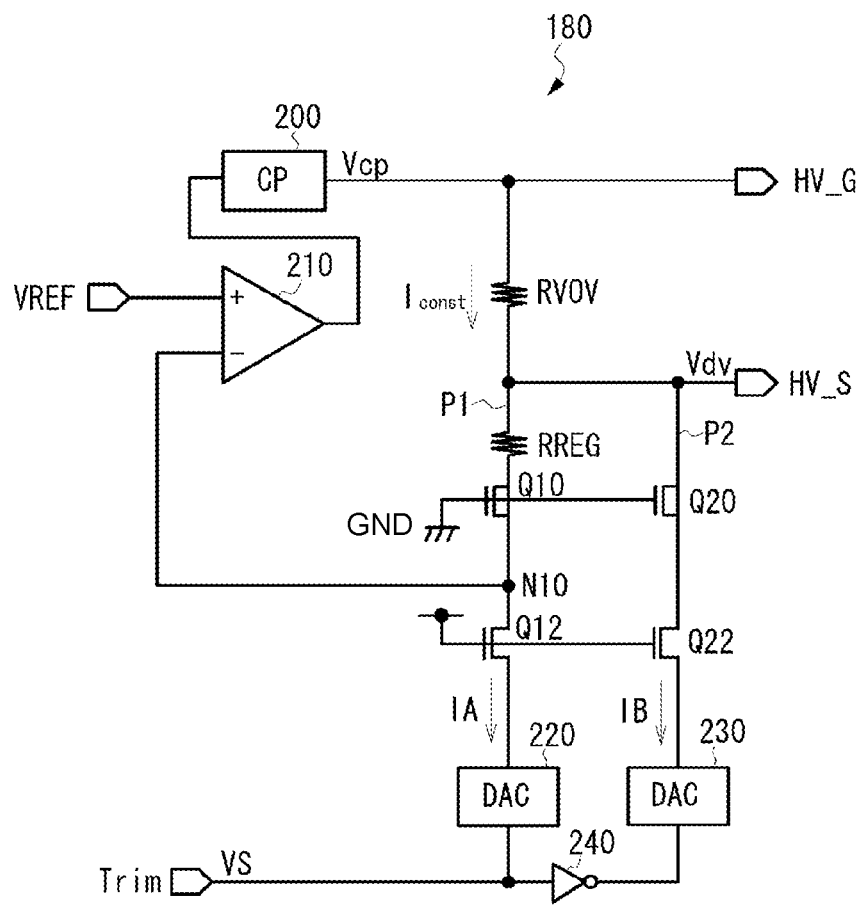
FIG. 3 is a diagram showing the configuration of a voltage generation circuit according to the first embodiment of the disclosure.

Next, details of the voltage generation circuit 180 of the present embodiment will be described. FIG. 3 shows the internal configuration of the voltage generation circuit 180 of the present embodiment. The voltage generation circuit 180 includes a charge pump 200, a comparator 210 controlling the operation of the charge pump 200, an output node HV_G outputting a boosted voltage Vcp from the charge pump 200, a resistor RVOV connected between the output node HV_G and an output node HV_S, and a current source circuit connected to the resistor RVOV. The current source circuit includes a first current path P1 and a second current path P2 connected in parallel between the output node HV_S and a reference potential (GND), a first DAC (digital to analog converter) 220 connected to the first current path P1, a second DAC 230 connected to the second current path P2, and an inverter 240 inverting a voltage generation code VS supplied from a node Trim.

The charge pump 200 boosts the inputted voltage and outputs the boosted voltage Vcp to the output node HV_G. The charge pump 200 generates the boosted voltage Vcp by alternately driving a plurality of cascade-connected transistors by two clock signals having different phases, for example. A reference voltage VREF is supplied to the non-inverting input of the comparator 210, and the voltage of the node N10 of the first current path P1 is supplied to the inverting input. The comparator 210 enables the clock signal of the charge pump 200 when the voltage of the node N10 is lower than the reference voltage VREF and disables the clock signal of the charge pump 200 when the voltage of the node N10 becomes higher than the reference voltage VREF.

The resistor RVOV is formed between the output node HV_G and the output node HV_S for generating a driving voltage Vdv obtained by lowering the boosted voltage Vcp. The resistor RVOV is composed of a conductive polysilicon strip, for example.

In the first current path P1, a resistor RREG for generating the boosted voltage, a depletion type NMOS transistor Q10, an enhancement type NMOS transistor Q12, and the first DAC 220 are connected in series. The gate of the transistor Q10 is connected to the GND. The transistor Q10 functions as a voltage relaxation element or a protection element. A Vcc power source voltage is connected to the gate of the transistor Q12, and a current having a certain value or higher is prevented from flowing through the first current path P1. Here, it should be noted that the transistors constituting the transistors Q12 and Q22, the DAC 220 and 230, and the inverter 240 are not applied with a high voltage and thus may be constituted by low withstand voltage transistors.

In the second current path P2, a depletion type NMOS transistor Q20, an enhancement type NMOS transistor Q22, and the second DAC 230 are connected in series. The gate of the transistor Q20 is connected to the GND, the gate of the transistor Q22 is connected to the Vcc power source voltage, and the transistors Q20 and Q22 operate in the same manner as the transistors Q10 and Q12 of the first current path P1.

The first DAC 220 includes a current source that is selectively operated based on the voltage generation code VS, and determines a current IA flowing through the first current path P1. The second DAC 230 is a current source having the same configuration as the first DAC 220, and determines a current IB to be flowed through the second current path P2 based on a code obtained by inverting the voltage generation code VS. When the maximum current that is allowed to flow in the DAC is set to IMAX, the relationship of IMAX=IA+IB is satisfied. Therefore, the current IA flows through the first current path P1, the current IB flows through the second current path P2, a constant current Iconst (Iconst=IA+IB) flows through the resistor RVOV for generating the driving voltage, and a potential difference of the current Iconst×the resistor RVOV is formed between the output node HV_G and the output node HV_S.

Figure 4:
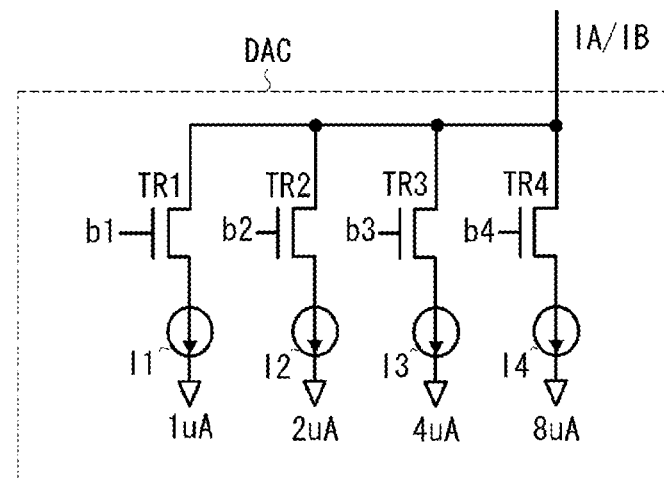
FIG. 4 is a diagram showing the configuration example of a DAC according to an embodiment of the disclosure.

FIG. 4 shows an example for explaining the operation of the DAC. The DAC has a plurality of NMOS transistors (four transistors TR1 to TR4 in the example of the figure) connected in parallel and constant current sources I1 to I4 connected in series to the transistors TR1 to TR4, for example. Four bits (b1, b2, b3, and b4) of the voltage generation code VS are inputted to the gates of the transistors TR1 to TR4, by which on/off of the transistors TR1 to TR4 is controlled. The constant current sources I1 to I4 apply constant currents of 1 µA, 2 µA, 4 µA, and 8 µA, for example. By combining the 4 bits of the voltage generation code VS, it is possible to set 16 currents, that is, a step current of 1 µA can be set from 0 µA to 15 µA, to be flowed through the first current path P1. For example, if a current of 1 µA flows through the first current path P1, a current of 15 µA flows through the second current path P2, and if a current of 5 µA flows through the first current path P1, a current of 11 µA flows through the second current path P2.

Figure 1A:
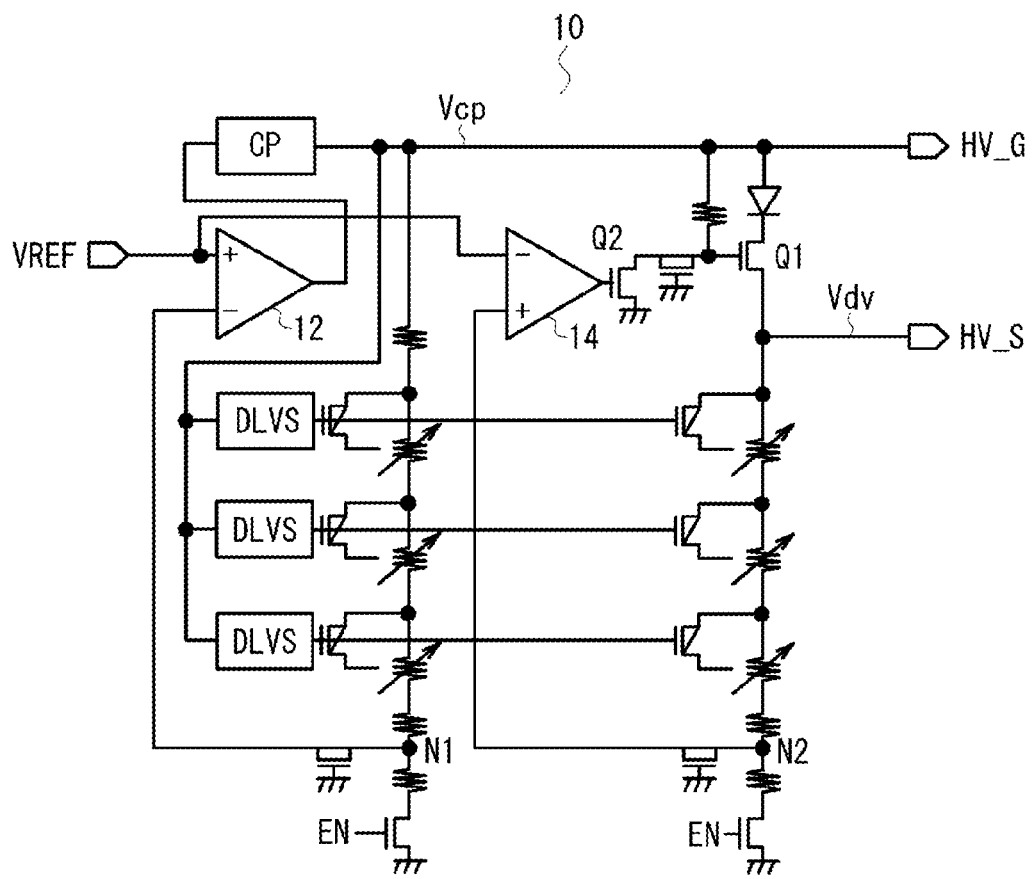
FIG. 1A and FIG. 1B are diagrams showing the configuration of a conventional voltage generation circuit.
Figure 1B:
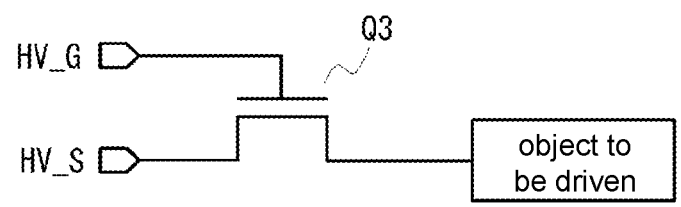

When performing the reading operation, the programming operation, the erasing operation, and so on, the control part 140 outputs the voltage generation code VS to the voltage generation circuit 180 to generate the required driving voltage Vdv. For example, during the programming operation, the control part 140 supplies the voltage generation code VS for generating the programming voltage to the voltage generation circuit 180. The first DAC 220 and the second DAC 230 determine the current IA flowing through the first current path P1 and the current IB flowing through the second current path P2 based on the voltage generation code VS. The constant current of Iconst (IA+IB) flows through the resistor RVOV, and the driving voltage Vdv, obtained by lowering the boosted voltage Vcp by the resistor RVOV×Iconst, is generated at the node HV_S. The driving voltage Vdv is applied, as the programming voltage, to the selected word line via the selection transistor Q3, as shown in FIG. 1B. The boosted voltage Vcp which is sufficiently higher than the driving voltage Vdv is applied to the gate of the selection transistor Q3. By appropriately adjusting the current Iconst, it is possible to obtain the boosted voltage Vcp and the driving voltage Vdv in consideration of the substrate bias effect. In addition, when varying the programming voltage by ISPP, the control part 140 changes the voltage generation code VS, varies the currents IA and IB of the first and second DAC, and changes the driving voltage Vdv.

During the erasing operation, the control part 140 supplies the voltage generation code VS for generating the erasing voltage to the voltage generation circuit 180, and causes the erasing voltage corresponding to the voltage generation code VS to be generated at the output node HV_S. Similarly, during the reading operation, the control part 140 supplies the voltage generation code VS for generating the reading pass voltage to the voltage generation circuit 180, and causes the reading pass voltage corresponding to the voltage generation code VS to be generated at the output node HV_S.

In an embodiment, the voltage generation code may include trimming information at the time of product shipping. Since the voltage generated by the chip fluctuates, the trimming information is for compensating for such fluctuation. For example, the trimming information is stored in a fuse cell (a region not accessed by the user) of the memory cell array. When a power-on sequence is executed, the trimming information read from the fuse cell is set to a configuration register or the like. The control part 140 generates the voltage generation code reflecting the trimming information. In another embodiment, the voltage generation code reflecting the trimming information may be prepared in advance and stored in the fuse cell. In that case, the control part 140 may read the voltage generation code from the fuse cell and use the voltage generation code directly.

As described above, unlike the related art, no level shifter is used in the present embodiment. Therefore, the circuit scale of the voltage generation circuit may be reduced. Furthermore, unlike the related art, the resistors RVOV and RREG may be used as high withstand voltage elements instead of the high withstand voltage transistors Q1 and Q2 in the present embodiment. Therefore, it is easy to design the circuit elements and manufacture the circuit elements. In addition, by controlling the current with the DAC, it is possible to generate the appropriate driving voltage Vdv in consideration of the substrate bias effect and to realize low power consumption.

Figure 5:
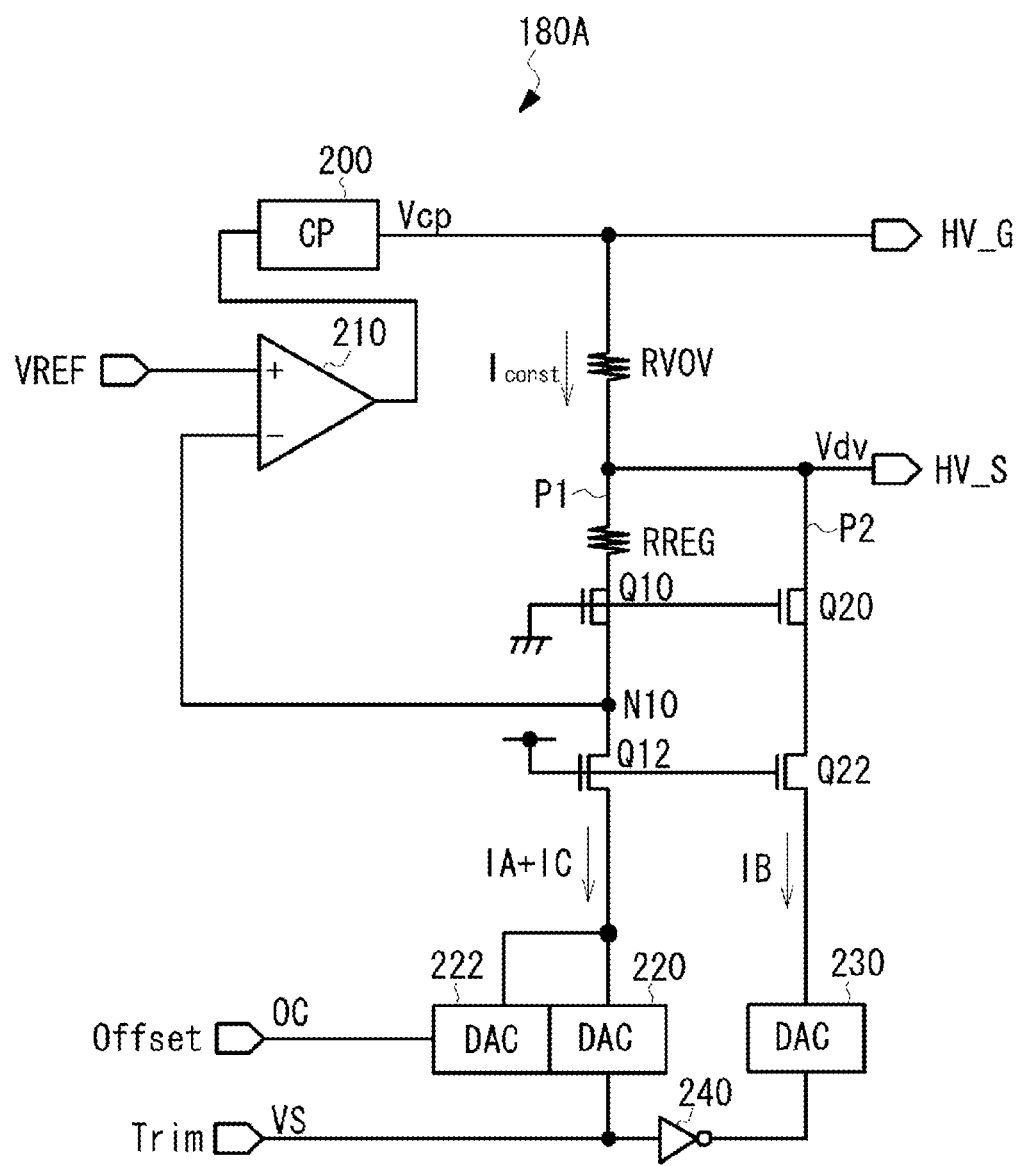
FIG. 5 is a diagram showing the configuration of a voltage generation circuit according to the second embodiment of the disclosure.
Figure 6:
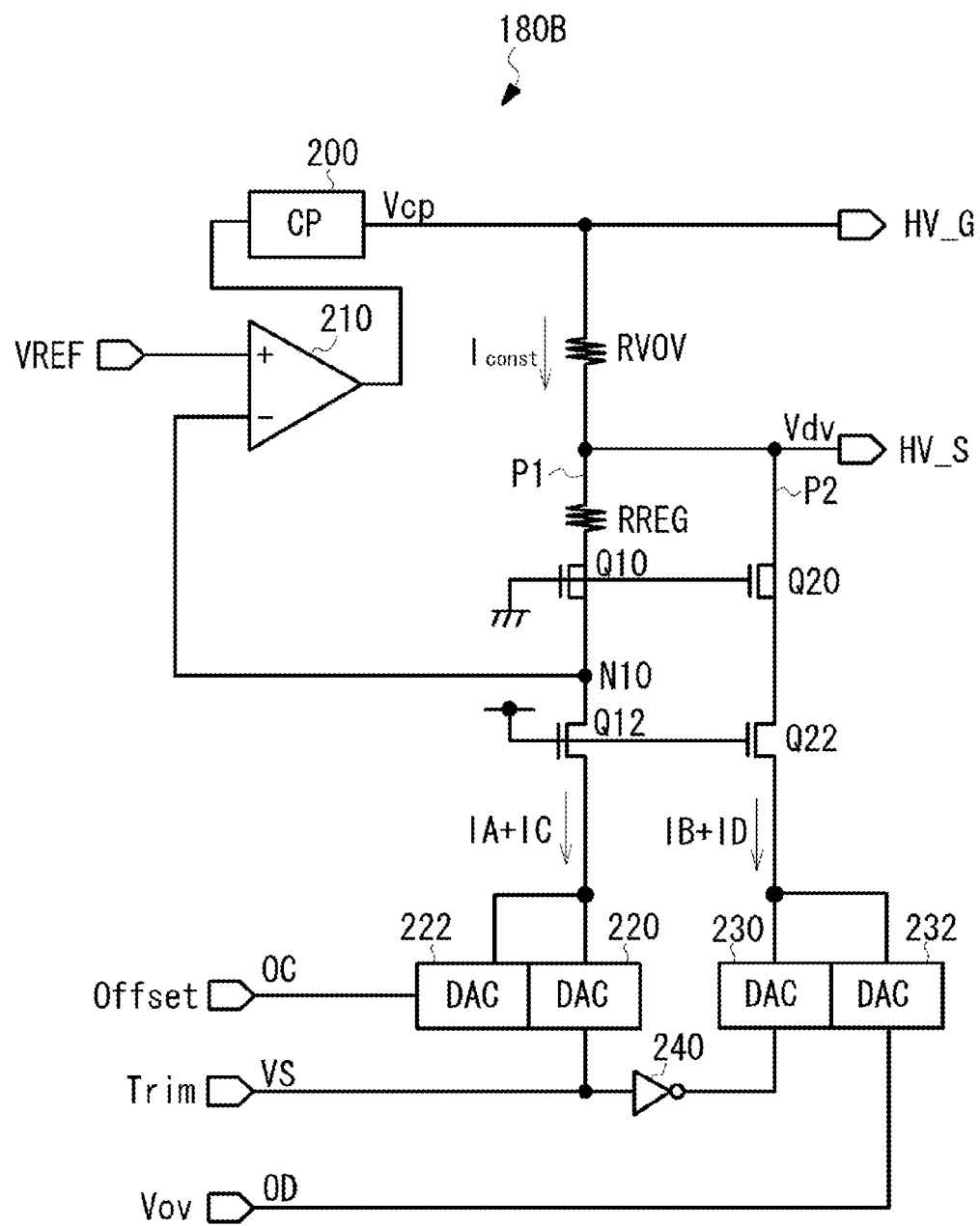
FIG. 6 is a diagram showing the configuration of a voltage generation circuit according to the third embodiment of the disclosure.

Next, the second embodiment of the disclosure will be described. FIG. 5 is a diagram showing the configuration of a voltage generation circuit 180A of the second embodiment. In the second embodiment, a third DAC 222 to be controlled based on an offset code OC is added to the first current path P1. The third DAC 222 does not necessarily have the same configuration as the first DAC 220, and the third DAC 222 determines the constant current independently according to the offset code OC, which is independent of the voltage generation code VS. Therefore, the current IA determined by the first DAC 220 and a current IC determined by the third DAC 222 flow through the first current path P1, and a current of Iconst (IA+IB+IC) flows through the resistor RVOV.

For example, when the desired driving voltage Vdv is not outputted from the output node HV_S or when adjustment is required, the offset code OC may be used as an additional code. Since changing the reference voltage VREF of the comparator 210 may also affect other analog circuits that use the reference voltage VREF, it is undesirable to change the reference voltage VREF. The Iconst flowing through the resistor RVOV may be changed by the offset code OC to adjust the driving voltage Vdv. The offset code OC may be stored in the memory cell array or other registers, for example, in a test operation of the IC chip. When the offset code OC is set, the control part 140 outputs the offset code OC and the voltage generation code VS to the voltage generation circuit 180A, so as to generate the desired driving voltage Vdv at the output node HV_S.

Next, the third embodiment of the disclosure will be described. In the third embodiment, a fourth DAC 232 is added to the second current path P2. The fourth DAC 232 does not necessarily have the same configuration as the second DAC 230, and the fourth DAC 232 determines the constant current independently according to an overdrive code OD, which is independent of the voltage generation code VS. Therefore, the current IB determined by the second DAC 230 and a current ID determined by the fourth DAC 232 flow through the second current path P2, and a current of Iconst (IA+IB+IC+ID) flows through the resistor RVOV.

The fourth DAC 232 causes the current ID to flow through the second current path P2 based on the overdrive code OD, by which the driving voltage Vdv may be controlled independently. In an embodiment, the overdrive code OD may be set according to the value of the boosted voltage Vcp. For example, when the boosted voltage Vcp is higher than a certain value, the overdrive code OD is set so as to increase the difference between the boosted voltage Vcp and the driving voltage Vdv, and when the driving voltage Vcp is lower than a certain value, the overdrive code OD is set so as to decrease the difference between the boosted voltage Vcp and the driving voltage Vdv, so as to generate the driving voltage Vdv in consideration of the substrate bias effect.

The above embodiments illustrate examples of applying the voltage generation circuit to a NAND type flash memory, but the disclosure is not limited thereto. The disclosure may be applied to all types of semiconductor memories that require generation of the driving voltage by using the booster circuit.

Exemplary embodiments of the disclosure have been described in detail as above. However, the disclosure is not limited to the specific embodiments, and various modifications and changes can be made within the scope of the gist of the disclosure as defined in the claims.

What is claimed is:

1. A voltage generation circuit, comprising:
   a booster circuit outputting a boosted voltage to a first node;
   a first resistor connected between the first node and a second node; and a current source circuit having a first current path and a second current path connected in parallel between the second node and a reference potential, wherein the first current path comprises a second resistor and a first current source connected in series to the second resistor and a first DAC, and the first current source generates a first constant current flowing through the first current path determined by the first DAC corresponding to a first digital code, the second current path comprises a second current source having a configuration same as the first current source, and the second current source generates a second constant current flowing through the second current path determined by the second DAC corresponding to a second digital code obtained by inverting the first digital code, and the voltage generation circuit generates a voltage determined by the first digital code and the second digital code at the second node.

2. The voltage generation circuit according to claim 1, wherein a current flowing through the first resistor is obtained by adding the first constant current and the second constant current.

3. The voltage generation circuit according to claim 1, wherein the first current source comprises a plurality of current sources that are operated selectively based on the first digital code, and the second current source comprises a plurality of current sources that are operated selectively based on the second digital code.

4. The voltage generation circuit according to claim 1, further comprising an inverting circuit inverting the first digital code, wherein the first digital code is supplied to the first current source, and the second digital code inverted by the inverting circuit is supplied to the second current source.

5. The voltage generation circuit according to claim 1, wherein the first digital code and the second digital code comprise trimming information for adjusting the voltage outputted from the second node.

6. The voltage generation circuit according to claim 1, wherein the first current path further comprises a third current source connected in parallel to the first current source, and the third current source generates a third constant current corresponding to a third digital code, and a current obtained by adding the first constant current and the third constant current flows through the first current path.

7. The voltage generation circuit according to claim 6, wherein the third digital code adjusts a difference between a voltage outputted from the first node and the voltage outputted from the second node.

8. The voltage generation circuit according to claim 1, wherein the second current path further comprises a fourth current source connected in parallel to the second current source, and the fourth current source generates a fourth constant current corresponding to a fourth digital code, and a current obtained by adding the second constant current and the fourth constant current flows through the second current path.

9. The voltage generation circuit according to claim 8, wherein the fourth digital code is variable according to a value of the voltage outputted from the second node.

10. The voltage generation circuit according to claim 1, wherein the first current path comprises a protection element between the second resistor and the first current source, and the second current path comprises a protection element between the second node and the second current source.

11. The voltage generation circuit according to claim 1, wherein the first resistor and the second resistor are composed of a conductive polysilicon.

12. The voltage generation circuit according to claim 1, wherein a MOS transistor included in the booster circuit is for a high withstand voltage, and a MOS transistor included in the current source circuit is for a low withstand voltage as compared with the transistor of the booster circuit.

13. The voltage generation circuit according to claim 1, further comprising a comparator comparing a voltage of a third node of the first current path with a reference voltage and controlling an operation of the booster circuit based on a comparison result.

14. A semiconductor memory device, comprising:
a voltage generation circuit;
a memory cell array;
a controller controlling an operation related to the memory cell array; and
a driving circuit driving the memory cell array,
wherein the voltage generation circuit comprises:
a booster circuit outputting a boosted voltage to a first node;
a first resistor connected between the first node and a second node; and
a current source circuit having a first current path and a second current path connected in parallel between the second node and a reference potential,
wherein the first current path comprises a second resistor and a first current source connected in series to the second resistor and a first DAC, and the first current source generates a first constant current flowing through the first current path determined by the first DAC corresponding to a first digital code,
the second current path comprises a second current source having a configuration same as the first current source, and the second current source generates a second constant current flowing through the second current path determined by the second DAC corresponding to a second digital code obtained by inverting the first digital code,
the voltage generation circuit generates a voltage determined by the first digital code and the second digital code at the second node, and
the voltage generated at the second node of the voltage generation circuit is supplied to the driving circuit.

15. The semiconductor memory device according to claim 14, wherein the driving circuit comprises an N-type MOS transistor, and the voltage of the first node is supplied to a gate of the N-type MOS transistor and the voltage of the second node is supplied to a drain of the N-type MOS transistor.

16. The semiconductor memory device according to claim 14, wherein the controller causes the second node to generate a programming voltage via the first digital code and the second digital code when the memory cell array is programmed.

17. The semiconductor memory device according to claim 14, wherein the controller causes the second node to generate an erasing voltage via the first digital code and the second digital code when the memory cell array is erased.

18. The semiconductor memory device according to claim 14, wherein the memory cell array comprises a NAND string.

* * * * *